United States Patent
Schwarz

[11] Patent Number: 6,029,656
[45] Date of Patent: *Feb. 29, 2000

[54] ENERGY COLLECTOR

[75] Inventor: Alois Schwarz, Kirchdorf, Austria

[73] Assignee: Eri-Energie-Ressourcen Institut Forschungs- und Entwicklungs GmbH, Kirchdorf/Tirol, Austria

[*] Notice: This patent issued on a continued prosecution application filed under 37 CFR 1.53(d), and is subject to the twenty year patent term provisions of 35 U.S.C. 154(a)(2).

[21] Appl. No.: 09/074,435

[22] Filed: May 7, 1998

[30] Foreign Application Priority Data

May 7, 1997 [AT] Austria ..................................... 783/97

[51] Int. Cl.[7] ............................................. F24J 2/08
[52] U.S. Cl. .......................... 126/684; 126/680; 126/634; 136/248; 136/259
[58] Field of Search .................... 126/684, 683, 126/680, 569, 634, 635, 651, 652; 136/243, 244, 246, 251, 253, 259, 256, 248

[56] References Cited

U.S. PATENT DOCUMENTS

| | | | |
|---|---|---|---|
| 1,704,173 | 3/1929 | Chesney | 126/680 |
| 2,688,922 | 9/1954 | Bonaventura et al. | 126/684 |
| 3,915,147 | 10/1975 | Rineer | 126/684 |
| 4,168,696 | 9/1979 | Kelly | 126/683 |
| 4,210,463 | 7/1980 | Escher | 126/684 |
| 4,230,095 | 10/1980 | Winston | 136/246 |
| 4,303,059 | 12/1981 | Ford | 126/684 |
| 4,339,627 | 7/1982 | Arnould | 126/684 |
| 4,388,481 | 6/1983 | Uroshevich | 136/246 |
| 4,427,838 | 1/1984 | Goldman | 136/246 |
| 4,746,370 | 5/1988 | Woolf | 136/246 |
| 5,220,462 | 6/1993 | Feldman, Jr. | 126/684 |
| 5,275,150 | 1/1994 | Lai | 126/569 |

FOREIGN PATENT DOCUMENTS

| | | |
|---|---|---|
| 0 614 058 B1 | 9/1997 | European Pat. Off. . |
| 28 16 945 | 10/1979 | Germany . |
| 29 07 115 | 9/1980 | Germany . |

*Primary Examiner*—Ira S. Lazarus
*Assistant Examiner*—Josiah C. Cocks
*Attorney, Agent, or Firm*—Herbert L. Lerner; Laurence A. Greenberg; Werner H. Stemer

[57] ABSTRACT

The energy collector has a housing with a cover which is transparent to visible and thermal radiation. One or more heat collectors are disposed in the interior of the housing. The heat collectors are carried by a pipe through which a heat-transport medium flows. Each of the collectors is assigned a reflector of concave design underneath the respective heat collector. The width of the reflector is significantly greater (e.g. a multiple) than the width of the heat collector. The incident visible and/or thermal radiation is either incident on the front side of the heat collector or it is reflected onto its rear side by the associated reflector. A large portion or all of the rear surface of the collector is covered with photovoltaic elements onto which focused light energy is aimed by the concave reflectors.

5 Claims, 5 Drawing Sheets

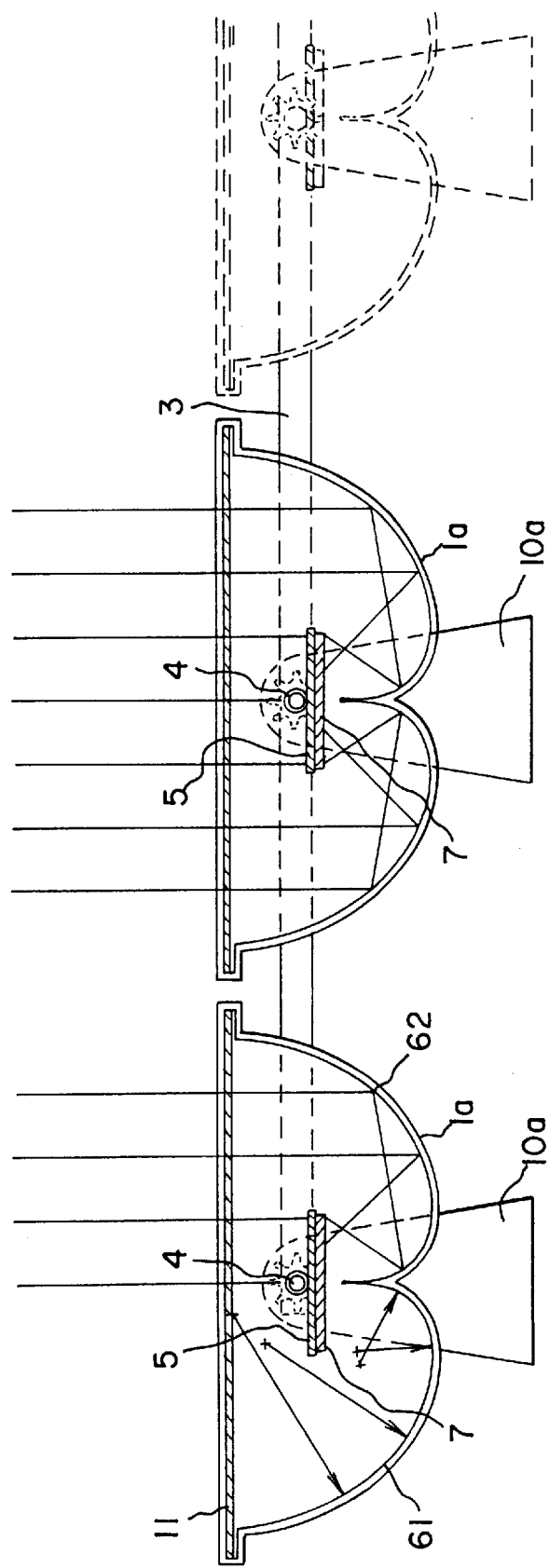

ENERGY COLLECTOR

BACKGROUND OF THE INVENTION

FIELD OF THE INVENTION

The invention pertains to an energy collector comprising a housing, which is designed to have at its upper side a covering made of a material that is transparent to visible and thermal radiation, and in whose interior there is disposed at least one heat collector, which is carried by a pipe through which a heat-transport medium can flow, and having a reflector of concave design which is arranged underneath each heat collector and whose width is significantly greater than the width of the heat collector assigned to respective reflector. As a result, the incident visible and/or thermal radiation either passes to the front side of the at least one heat collector or is reflected onto its rear side by means of the associated reflector.

An energy collector of that type is disclosed in European patent disclosure EU A1 614 058. However, the prior art energy collector is used solely to feed thermal energy to the heat collectors, the energy being carried away by means of the heat-transport medium flowing through the pipes and fed to a user, in that, for example, it is used in low-temperature heating or it serves to produce hot water for useful purposes.

Furthermore, light energy may be converted into electrical energy by means of photovoltaic elements. However, since the efficiency of photovoltaic elements decreases sharply at temperatures above 30° C., it has hitherto not been possible to apply focused visible radiation to photovoltaic elements. Rather, for this reason it is possible to apply only unfocused visible radiation to photovoltaic elements.

In order to obtain electrical energy by means of photovoltaic elements, it is thus necessary to connect a very large number of photovoltaic elements in series. However, in this case there is also the difficulty that the production of photovoltaic elements is very expensive. All of these facts taken together have hitherto rendered obtaining electrical energy from light energy so costly as to classify the prior art technology entirely uneconomic.

SUMMARY OF THE INVENTION

It is accordingly an object of the invention to provide an energy collector, which overcomes the above-mentioned disadvantages of the prior art devices and methods of this general type and which allows focussed visible radiation to be applied to photovoltaic elements without sharply decreasing their efficiency as a result.

With the foregoing and other objects in view there is provided, in accordance with the invention, an energy collector, comprising:

a housing defining a housing interior and having a cover transparent to visible and thermal radiation;

a pipe extending through the housing and carrying therein a heat-transport medium;

at least one heat collector supported on the pipe in the interior of the housing, the heat collector having a front surface and a rear surface;

a concave reflector disposed below the heat collector, the reflector having a width significantly greater than a width of the heat collector and being disposed so as to reflect incident radiation not absorbed on the front surface of the heat collector onto the rear surface of the heat collector; and photovoltaic elements on the rear surface of the heat collector receiving focused light energy from the concave reflector.

In other words, the object of the invention is satisfied with the photovoltaic elements which cover a large portion of the rear surface of the heat collector, onto which focused light energy is applied by means of the concave reflectors.

As a result of the fact that the visible radiation which is incident on the reflectors is focused by the latter, the photovoltaic elements on the rear side of the heat collectors are then supplied with concentrated light energy, as a result of which a very high efficiency is achieved. Since the thermal energy that is simultaneously supplied to the photovoltaic elements is carried away by the heat-transport medium flowing through the pipes, it is ensured that the temperature of 30° C., which is the maximum permissible in order to maintain the efficiency of the photovoltaic elements, is not exceeded.

Since it is thus possible, by means of an energy collector of this type, to obtain both thermal energy and, by means of the photovoltaic elements, electrical energy with costs which are significantly reduced with respect to the prior art, very high economy in obtaining electrical energy is achieved, in spite of the relatively high costs involved in the production of photovoltaic elements.

In accordance with an added feature of the invention, the width of the at least one heat collector is between one sixth and one half of the width of the reflector.

In accordance with an additional feature of the invention, the at least one reflector is formed with two part-reflectors of parabolic design disposed symmetrically relative to the heat collector such that each the part-reflector is assigned one half of the heat collector.

In accordance with another feature of the invention, the heat collector is pivotably supported in the housing relative to the reflector.

In accordance with a concomitant feature of the invention, a plurality of heat collectors are disposed in the housing, and one double reflector is associated with each respective heat collector.

Other features which are considered as characteristic for the invention are set forth in the appended claims.

Although the invention is illustrated and described herein as embodied in energy collector, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DESCRIPTION

FIGS. 4 and 4a are sectional views of the device according to FIG. 3, with different directions of incidence of the visible and thermal radiation.

DESCRIPTION OF THE PREFERRED EMBODIMENTS

Figure 1:
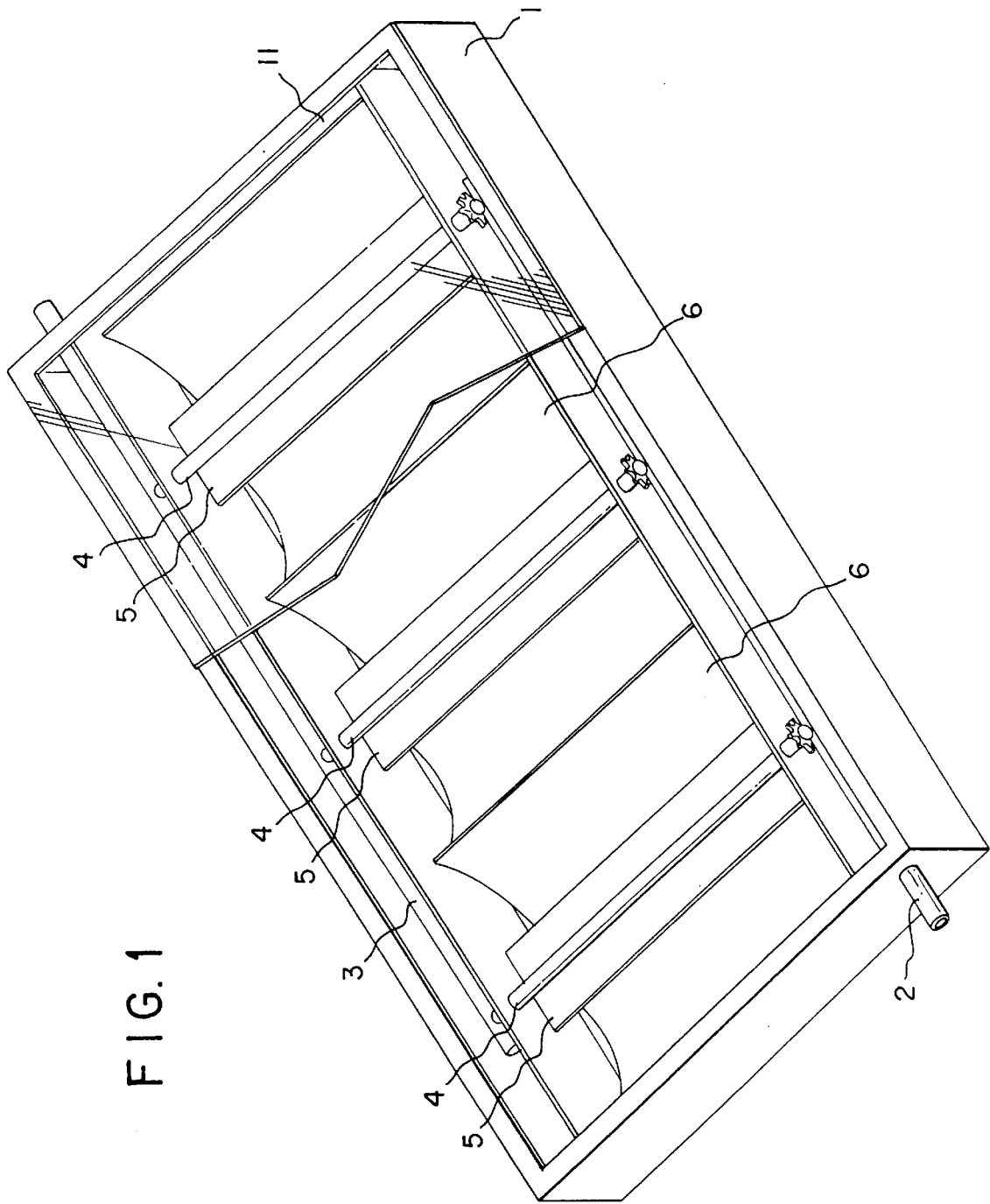
FIG. 1 is a top perspective view of a first exemplary embodiment of the novel device.

Referring now to the figures of the drawing in detail and first, particularly, to FIG. 1 thereof, there is seen an energy collector with a box-shaped housing 1 which, on its upper side, facing the irradiation of visible and thermal radiation, is covered with a cover 11 made of a material that is transparent to visible and thermal radiation. In the interior of the housing 1 there are disposed a distributor pipe 2 and a collector pipe 3, which are connected to each other by pipes 4 running transversely. Plate-shaped heat collectors 5 are carried by the pipes 4. There are reflectors 6 underneath the heat collectors 4.

Figure 2:
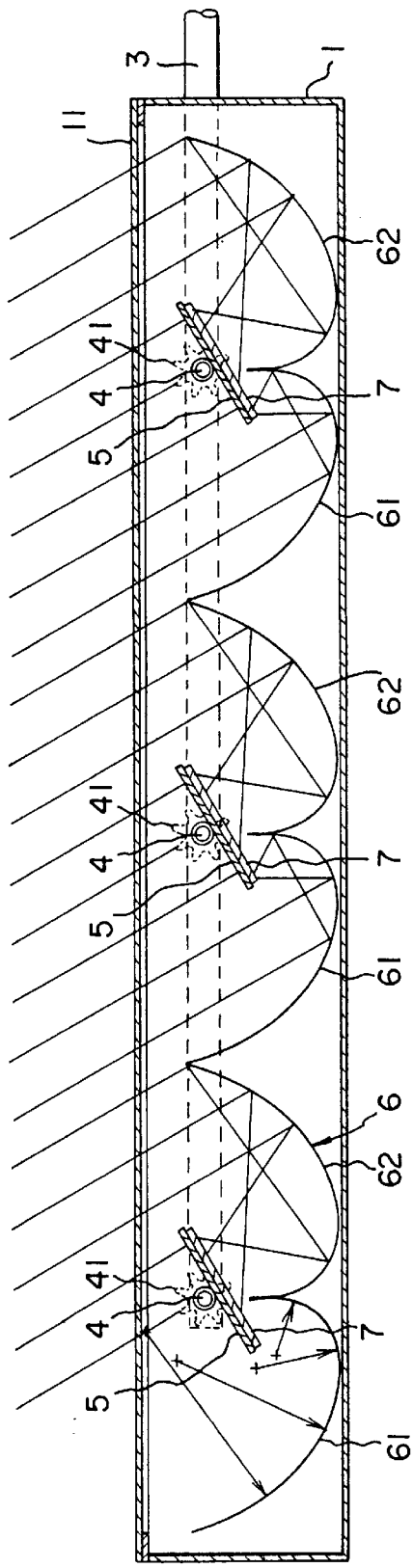
FIGS. 2 and 2a are longitudinal sectional views of the device according to FIG. 1, with different directions of incidence of the visible and thermal radiation.
Figure 2A:
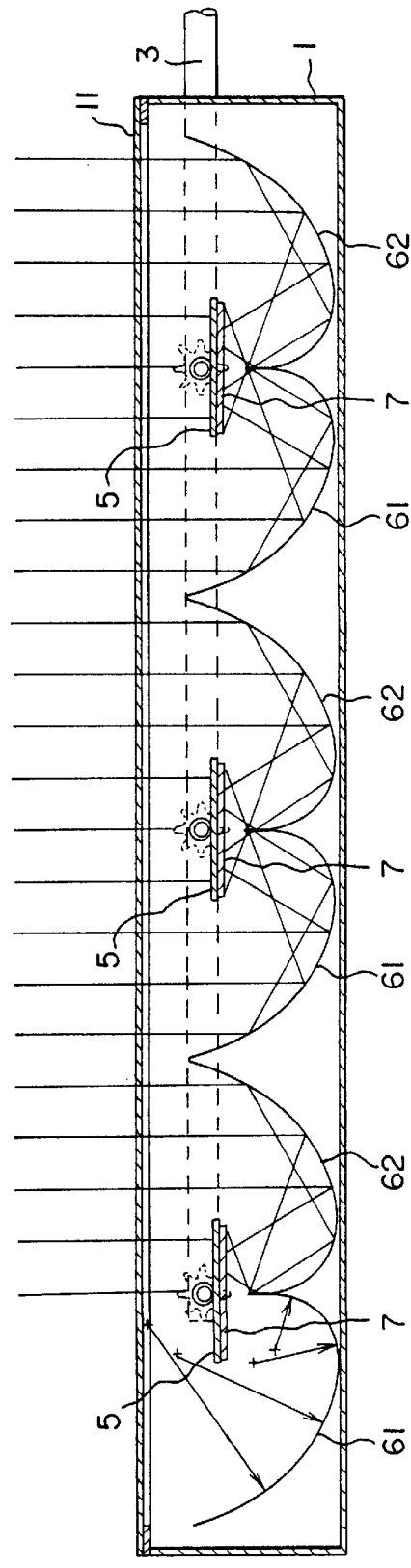

As can be seen also from FIGS. 2 and 2a, the heat collectors 5 are constructed, on the side facing the reflectors 6, with a multiplicity of photovoltaic elements 7, which are connected to one another in series. In addition, the pipes 4 are constructed with a pivot system formed with a toothed wheel 41, by means of which the heat collectors 5 are rotatable about the axis of the pipes 4.

The heat collectors 5 have a width which is approximately equal to one third of the width of the respectively associated reflector 6. In this case, the heat collectors 5 are situated approximately centrally above the two reflectors 6 and underneath the upper bounding edge of these reflectors 6. The reflectors 6 underneath the heat collectors 5 are formed in each case by two mutually joined reflector parts 61 and 62, which have a parabolic curvature. The curvature is designed such that the incident visible and thermal radiation is reflected onto the photovoltaic elements 7 disposed on the underside of the heat collectors 5.

The energy collector of this type operates as follows:

Visible and thermal radiation that is incident on the housing 1 may fall on the upper side of the heat collectors 5, as a result of which the latter are heated. The heat generated by this is carried away by a heat-transport medium which flows in through the distributor pipe 2, through the pipes 4, and out of the housing 1 through the collector pipe 3. There, the heated transport medium is supplied to a user, for example a low-temperature heating system, a heat pump, or a reservoir for hot water.

The radiation that is incident to the side of the heat collectors is reflected by the reflector parts 61 and 62 onto the photovoltaic elements 7, in which electrical current is generated as a result. Since the incident visible radiation is focussed onto the photovoltaic elements 7—due to the concave shape of the reflectors 6—a very high degree of efficiency is achieved in this way.

Due to the fact that the thermal energy that is irradiated onto the photovoltaic elements 7 is carried away via the heat collectors 5, by means of the heat-transport medium, it is ensured that, in spite of the focused radiation being incident on the photovoltaic elements 7, the temperature of 30° C., which is the maximum permissible for the photovoltaic elements, is not exceeded. The elements 7 are thus assured to operate within their highest efficiency temperature range.

In the exemplary embodiment according to FIG. 1, FIG. 2 and FIG. 2a, the box-shaped housing is rigidly fastened to a support, for example to the roof of a building. In order to enable the heat collectors 5 to follow the position of the sun, the heat collectors 5 are mounted such that they are rotatable by means of the toothed wheels 41 about the axes of the pipes 4.

Figure 3:
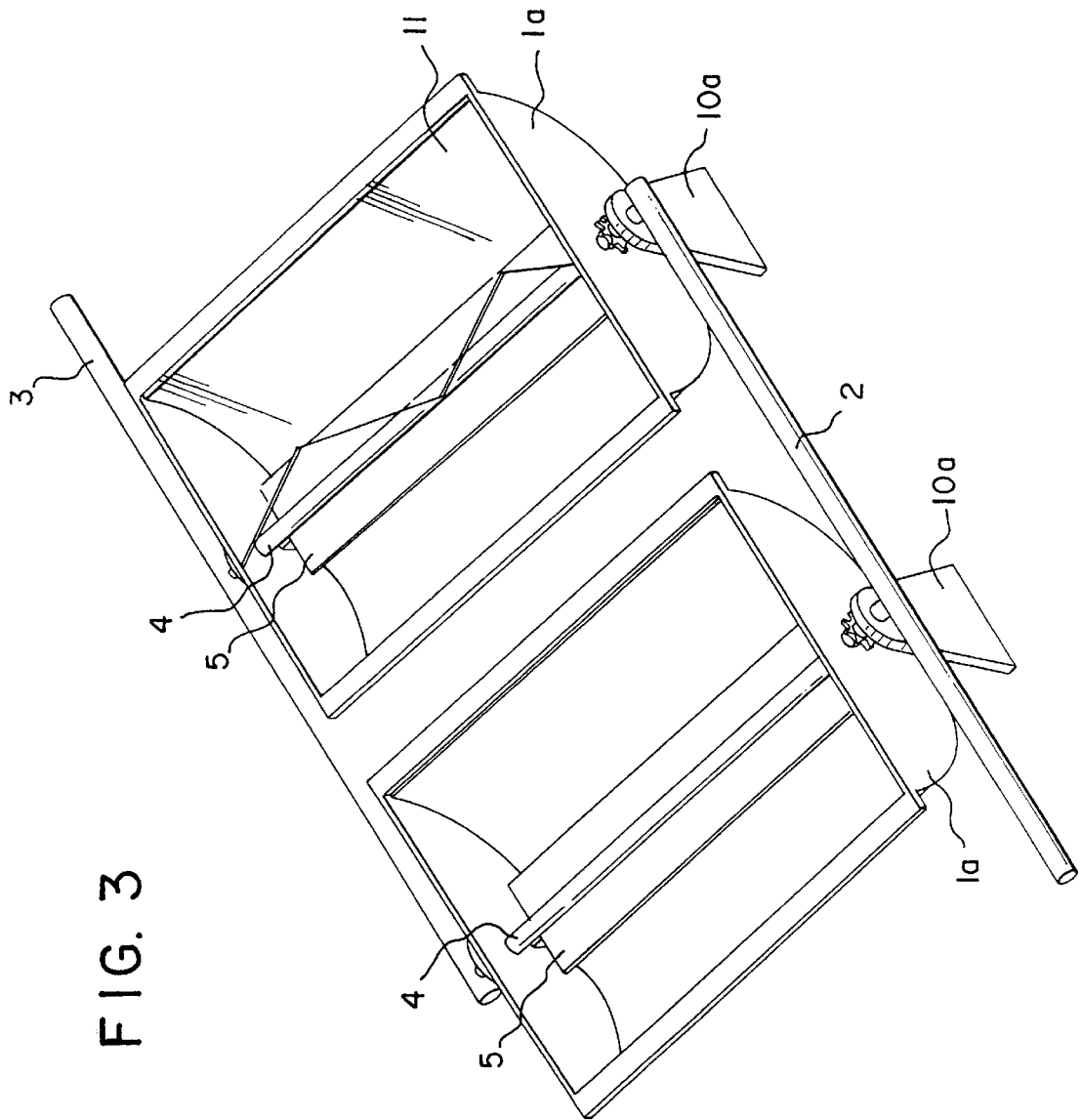
FIG. 3 is a top perspective view of a second exemplary embodiment of the novel device.
Figure 4:
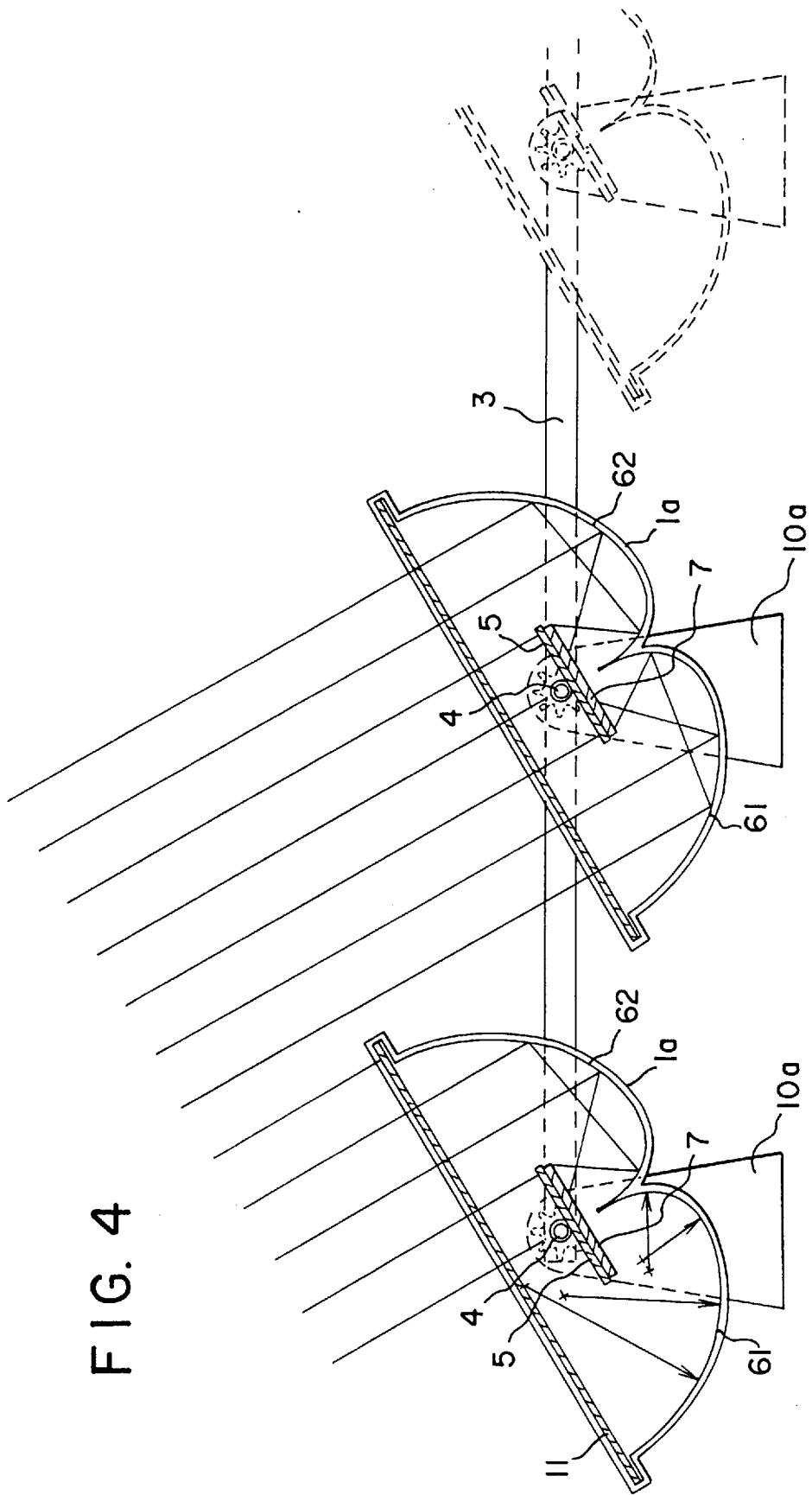

In the exemplary embodiment according to FIG. 3, FIG. 4 and FIG. 4a, each heat collector 5 is situated in a housing 1a which is formed by the reflectors and which is rotatable with respect to a supporting device 10a. The remaining portions of the second embodiment are equivalent to and they are understood from a reading of the foregoing description of the first embodiment of the invention.

I claim:

1. An energy collector, comprising:

a housing defining a housing interior and having a cover transparent to visible and thermal radiation;

a pipe extending through said housing and carrying therein a heat-transport medium;

at least one plate-shaped heat collector supported on said pipe in the interior of said housing, said plate-shaped heat collector having a substantially flat front surface and a substantially flat rear surface;

a concave reflector disposed below said heat collector, said reflector having a width significantly greater than a width of said heat collector and being disposed so as to reflect incident radiation not absorbed on the front surface of said heat collector onto the rear surface of said heat collector; and substantially flat photovoltaic elements substantially covering the rear surface of said heat collector receiving focused light energy from said concave reflector.

2. The device according to claim 1, wherein the width of said at least one heat collector is between one sixth and one half of the width of said reflector.

3. The device according to claim 1, wherein said at least one reflector is formed with two part-reflectors of parabolic design disposed symmetrically relative to said heat collector such that each said part-reflector is assigned one half of said heat collector.

4. The device according to claim 1, wherein said heat collector is pivotally supported in said housing relative to said reflector.

5. The device according to claim 1, wherein said at least one heat collector is one of a plurality of heat collectors disposed in said housing, and said reflector is one of a plurality of reflectors each associated with a respective said heat collector.

* * * * *